(12) United States Patent
Huang

(10) Patent No.: US 11,487,333 B2
(45) Date of Patent: Nov. 1, 2022

(54) ELECTRONIC DEVICE AND FRAMEWORK ASSEMBLY FOR THE SAME

(71) Applicant: GETAC TECHNOLOGY CORPORATION, Hsinchu County (TW)

(72) Inventor: Tzu-Chiu Huang, Taipei (TW)

(73) Assignee: GETAC TECHNOLOGY CORPORATION

( * ) Notice: Subject to any disclaimer, the term of this patent is extended or adjusted under 35 U.S.C. 154(b) by 127 days.

(21) Appl. No.: 17/023,331

(22) Filed: Sep. 16, 2020

(65) Prior Publication Data
US 2021/0089092 A1 Mar. 25, 2021

Related U.S. Application Data

(60) Provisional application No. 62/904,967, filed on Sep. 24, 2019.

(51) Int. Cl.
| | |
|---|---|
| *G06F 1/16* | (2006.01) |
| *H01Q 1/22* | (2006.01) |
| *H05K 5/02* | (2006.01) |
| *H05K 5/06* | (2006.01) |
| *H05K 5/00* | (2006.01) |
| *H05K 5/04* | (2006.01) |
| *E05D 3/02* | (2006.01) |
| *E05D 5/04* | (2006.01) |
| *F16C 11/04* | (2006.01) |

(52) U.S. Cl.
CPC .......... *G06F 1/1698* (2013.01); *G06F 1/1683* (2013.01); *H01Q 1/2266* (2013.01); *E05D 3/02* (2013.01); *E05D 5/04* (2013.01); *E05Y 2900/606* (2013.01); *F16C 11/04* (2013.01); *G06F 1/1616* (2013.01); *G06F 1/1656* (2013.01); *G06F 1/1679* (2013.01); *H05K 5/0017* (2013.01); *H05K 5/0204* (2013.01); *H05K 5/04* (2013.01); *H05K 5/061* (2013.01); *H05K 5/069* (2013.01)

(58) Field of Classification Search
CPC .... G06F 1/1607; G06F 1/1605; G06F 1/1637; G06F 1/1656; G06F 1/1654; G06F 1/1683; G06F 1/1679; G06F 1/1616; G06F 1/1698; H05K 5/0017; H05K 5/04; H05K 5/0204; H05K 5/061; H01Q 1/243; H01Q 1/2266
USPC ....................................................... 343/702
See application file for complete search history.

(56) References Cited

U.S. PATENT DOCUMENTS

| | | | | |
|---|---|---|---|---|
| 6,456,499 B1 * | 9/2002 | Nakajima | ............ | H01Q 1/2266 361/752 |
| 6,809,690 B2 * | 10/2004 | Tao | ........................ | G06F 1/1637 343/702 |

(Continued)

*Primary Examiner* — Nidhi Thaker

(57) ABSTRACT

An electronic device and a framework assembly for the same are provided. The electronic device includes a base structure, an antenna module and a first decorative board. The base structure has a first surface and a second surface corresponding in position to the first surface. The base structure includes a base body, a receiving slot disposed on the base body, and a first positioning portion disposed on the receiving slot. The antenna module is disposed in the receiving slot of the base structure and includes a mount element and an antenna disposed on the mount element. The mount element includes a second positioning portion corresponding in position to the first positioning portion. The first decorative board is disposed on the first surface of the base structure.

5 Claims, 20 Drawing Sheets

(56) References Cited

U.S. PATENT DOCUMENTS

| | | | | |
|---|---|---|---|---|
| 7,142,886 | B2* | 11/2006 | Murayama | G06F 1/1616 455/575.8 |
| 7,170,452 | B2* | 1/2007 | Yang | H01Q 21/28 343/702 |
| 7,193,581 | B2* | 3/2007 | Tyler | G06F 1/1616 343/702 |
| 2002/0021250 | A1* | 2/2002 | Asano | H01Q 21/30 343/702 |
| 2004/0135730 | A1* | 7/2004 | Yang | H01Q 21/28 343/702 |
| 2004/0183732 | A1* | 9/2004 | Konishi | G06F 1/1679 343/702 |
| 2004/0233628 | A1* | 11/2004 | Homer | G06F 1/1632 361/679.28 |
| 2004/0239569 | A1* | 12/2004 | Park | H01Q 21/28 343/702 |
| 2007/0053144 | A1* | 3/2007 | Nakatani | G06F 1/1679 361/679.21 |
| 2007/0115187 | A1* | 5/2007 | Zhang | H01Q 1/2266 343/702 |
| 2007/0293005 | A1* | 12/2007 | Shigenobu | G06F 1/1698 438/238 |
| 2008/0048919 | A1* | 2/2008 | Jung | H01Q 1/12 343/893 |
| 2008/0225470 | A1* | 9/2008 | Cho | G06F 1/1616 361/829 |
| 2008/0309564 | A1* | 12/2008 | Booth | H01Q 1/12 343/702 |
| 2009/0284424 | A1* | 11/2009 | Yoon | H01Q 1/2266 343/702 |
| 2009/0303137 | A1* | 12/2009 | Kusaka | G06F 1/1683 343/702 |
| 2010/0277375 | A1* | 11/2010 | Chiu | H01Q 1/243 343/702 |
| 2011/0013347 | A1* | 1/2011 | Kinjou | G06F 1/1698 361/679.01 |
| 2012/0039058 | A1* | 2/2012 | Kinjou | G06F 1/1698 361/807 |
| 2013/0077227 | A1* | 3/2013 | Chen | G06F 1/1601 29/592.1 |
| 2014/0097997 | A1* | 4/2014 | Chang | H01Q 9/42 343/846 |
| 2014/0307393 | A1* | 10/2014 | Park | G06F 1/1626 361/727 |
| 2015/0103475 | A1* | 4/2015 | Yang | G06F 1/1658 361/679.02 |
| 2020/0059054 | A1* | 2/2020 | Hsu | G06F 1/162 |

* cited by examiner

US 11,487,333 B2

ELECTRONIC DEVICE AND FRAMEWORK ASSEMBLY FOR THE SAME

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present disclosure relates to electronic devices and, more particularly, to an electronic device applicable to a laptop and a framework assembly for the electronic device.

Description of the Prior Art

A conventional display unit assembly of a laptop is usually made of plastic, that is, both element A and element B of the laptop are made of plastic. Therefore, an antenna disposed at the frame of the display unit assembly is not affected by the elements A, B made of plastic. However, the conventional display unit assembly is vulnerable to a hit when both the elements A, B of the laptop are made of plastic.

Furthermore, it is impossible for conventional laptops to have both enhanced structural strength and unabated performance of antenna signal reception and transmission. Therefore, it is imperative to make improvements to structural design, so as to enhance the structural strength of laptops without affecting the performance of antenna signal reception and transmission.

SUMMARY OF THE INVENTION

It is an objective of the present disclosure to provide an electronic device and a framework assembly for the same.

In order to achieve the above and other objectives, the present disclosure provides an electronic device comprising a base structure, an antenna module and a first decorative board. The base structure has a first surface and a second surface corresponding in position to the first surface. The base structure comprises a base body, a receiving slot disposed on the base body, and a first positioning portion disposed on the receiving slot. The antenna module is disposed in the receiving slot of the base structure. The antenna module comprises a mount element and an antenna disposed on the mount element. The mount element comprises a second positioning portion corresponding in position to the first positioning portion. The first decorative board is disposed on the first surface of the base structure.

In order to achieve the above and other objectives, the present disclosure further provides a framework assembly comprising a backboard and a mount element. The backboard comprises a base body, a receiving slot disposed on the base body, and a first positioning portion disposed on the receiving slot. The mount element is disposed on the backboard. The mount element comprises a second positioning portion corresponding in position to the first positioning portion.

One of the beneficial effects of the present disclosure is as follows: an electronic device and a framework assembly for the same, as provided by the present disclosure, are characterized in that a mount element comprises a second positioning portion corresponding in position to a first positioning portion, such that the mount element can be firmly disposed on a base body.

The technical features of the present disclosure are illustrated by specific embodiments, depicted with drawings, and described below. However, the drawings serve exemplary and illustrative purposes rather than limit the present disclosure.

DETAILED DESCRIPTION OF THE EMBODIMENTS

An electronic device and a framework assembly for the same are provided according to the present disclosure and hereunder illustrated by specific embodiments. Persons skilled in the art can gain insight into its advantages and effects accordingly. The present disclosure can be implemented or applied in accordance with any other variant embodiments. Various modifications and changes may be made to the details described in the specification from different perspectives and for different applications without departing from the spirit of the present disclosure. The accompanying drawings are deemed illustrative and thus are not drawn to scale. The embodiments presented below are illustrative of the technical features of the present disclosure rather than restrictive of the claims of the present disclosure. Although ordinal numbers, such as "first," "second," and "third," are used herein to specify components, the ordinal numbers are intended to distinguish the components from each other rather than limit them. The conjunction "or" used before the last in a list of possibilities must be interpreted, as appropriate, to mean an "exclusive or" or an "inclusive or".

Embodiment

Figure 1:
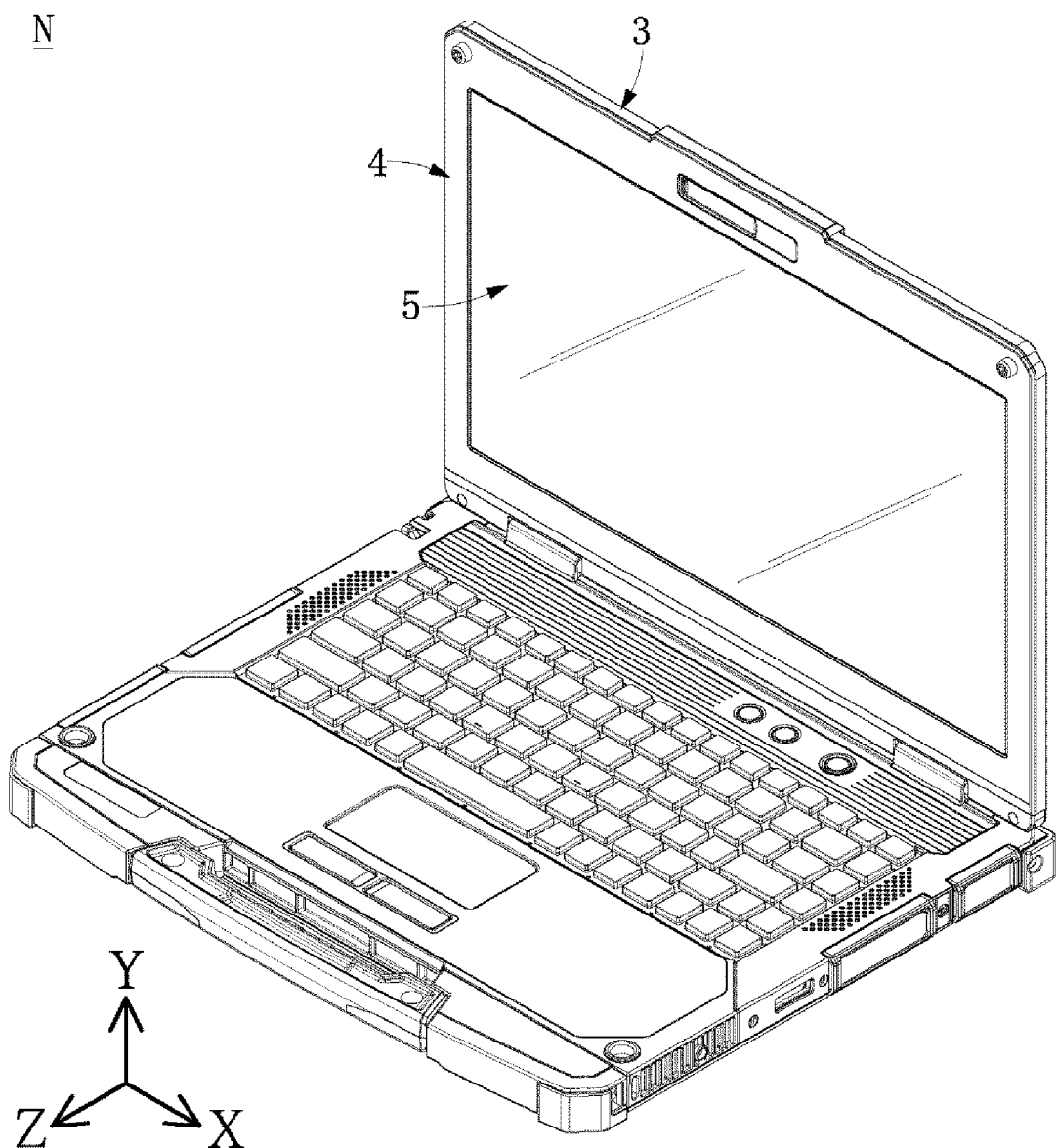
FIG. 1 is a perspective view of an electronic device according to an embodiment of the present disclosure.
Figure 2:
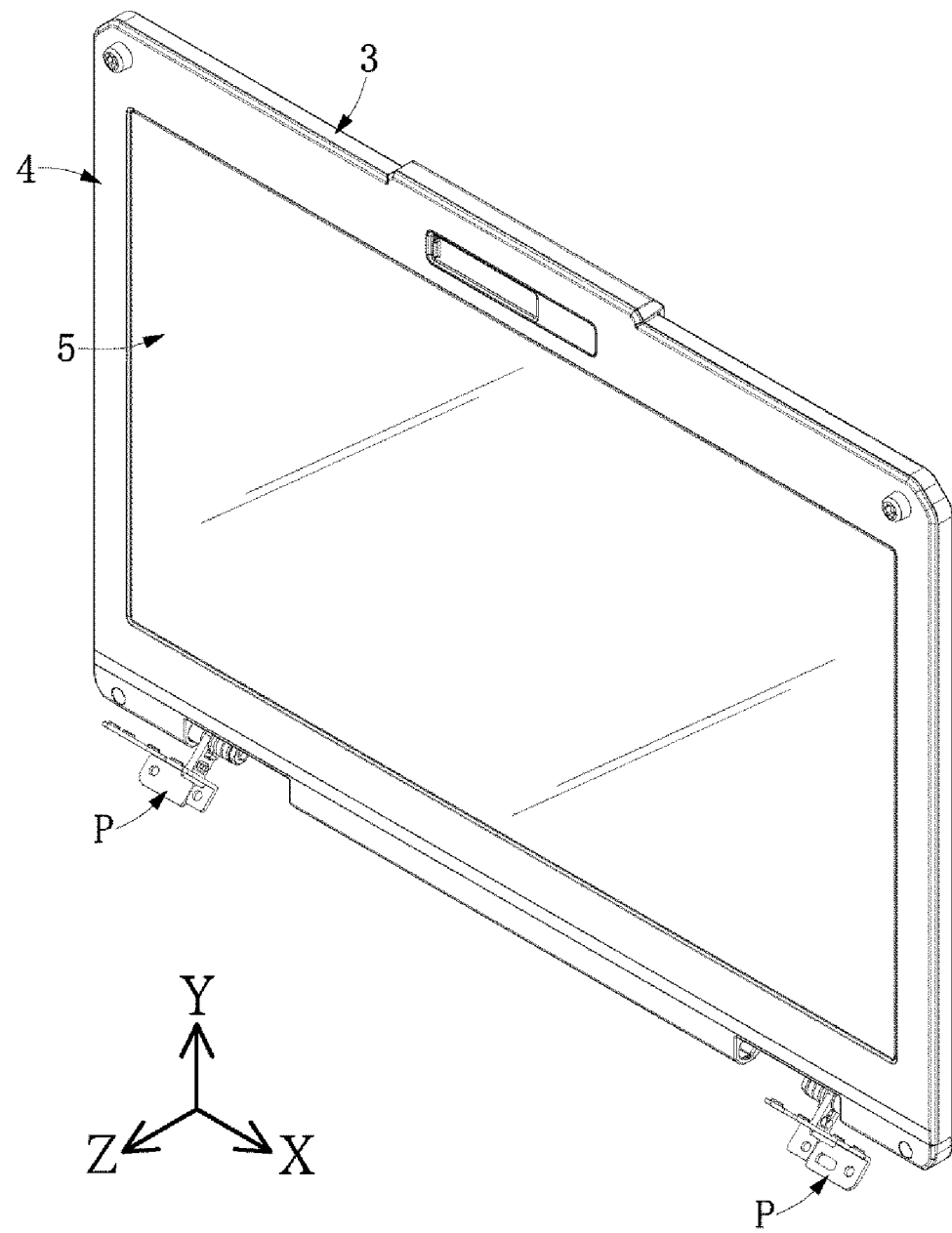
FIG. 2 is an assembled perspective view of the electronic device according to an embodiment of the present disclosure.
Figure 3:
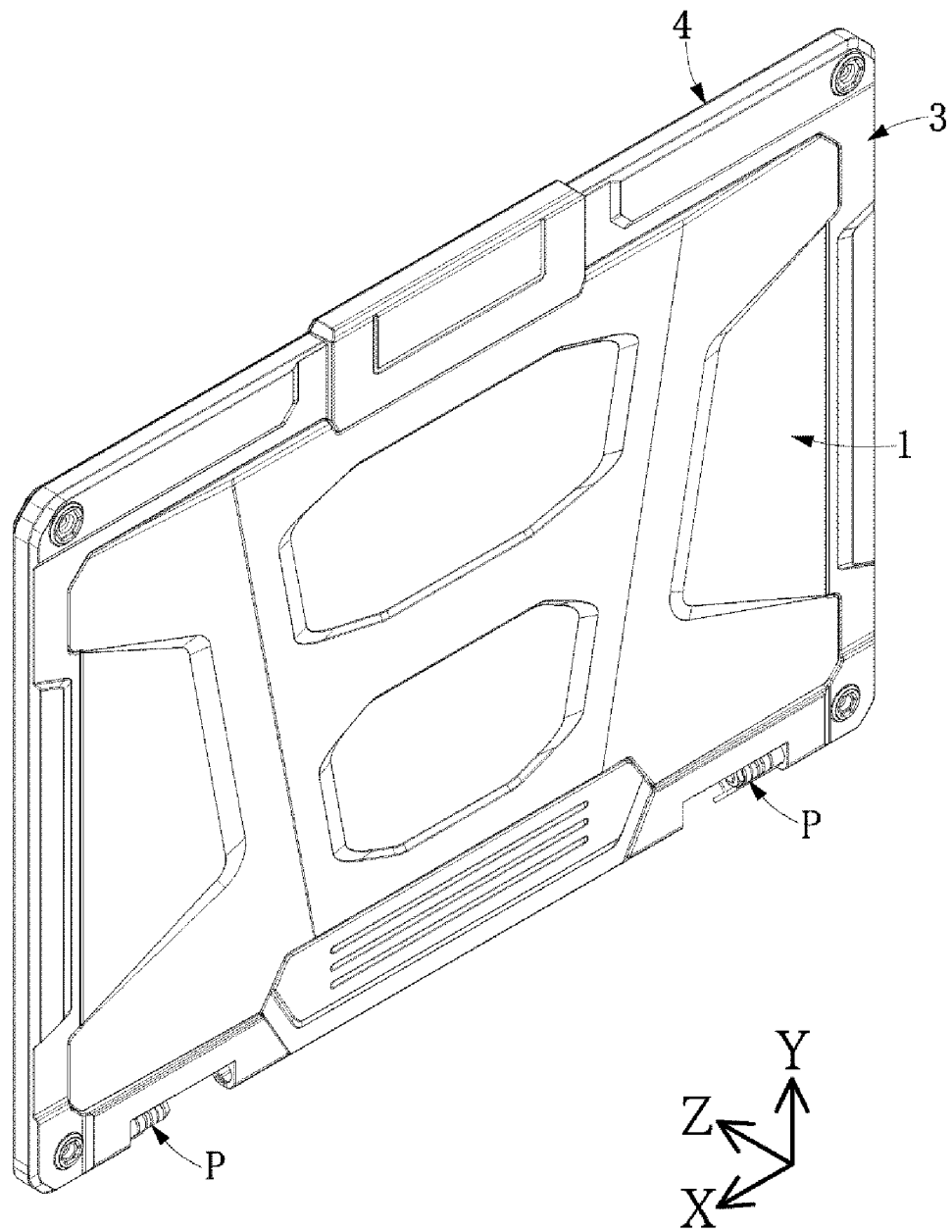
FIG. 3 is another assembled perspective view of the electronic device according to an embodiment of the present disclosure.

Refer to FIG. 1 through FIG. 3. FIG. 1 is a perspective view of an electronic device according to an embodiment of the present disclosure. FIG. 2 and FIG. 3 are assembled perspective views of the electronic device according to an embodiment of the present disclosure. For instance, the present disclosure provides an electronic device N and a framework assembly F for the same (see FIG. 4 and FIG. 5). The electronic device N is a display unit of a laptop. The framework assembly F is applicable to the electronic device N. In an embodiment, the framework assembly F is applicable to the display unit of a laptop, but the present disclosure is not limited thereto. The electronic device N is hereunder described in detail, and then the framework assembly F for the electronic device N is hereunder described in detail and illustrated by embodiments. Although the electronic device N of the present disclosure is exemplified by a display unit of a laptop, the present disclosure is not limited to the electronic device N and framework assembly F. Among the accompanying drawings of the present disclosure, only FIG. 1 shows a laptop in its entirety in order to depict the connections of its constituent elements.

Figure 4:
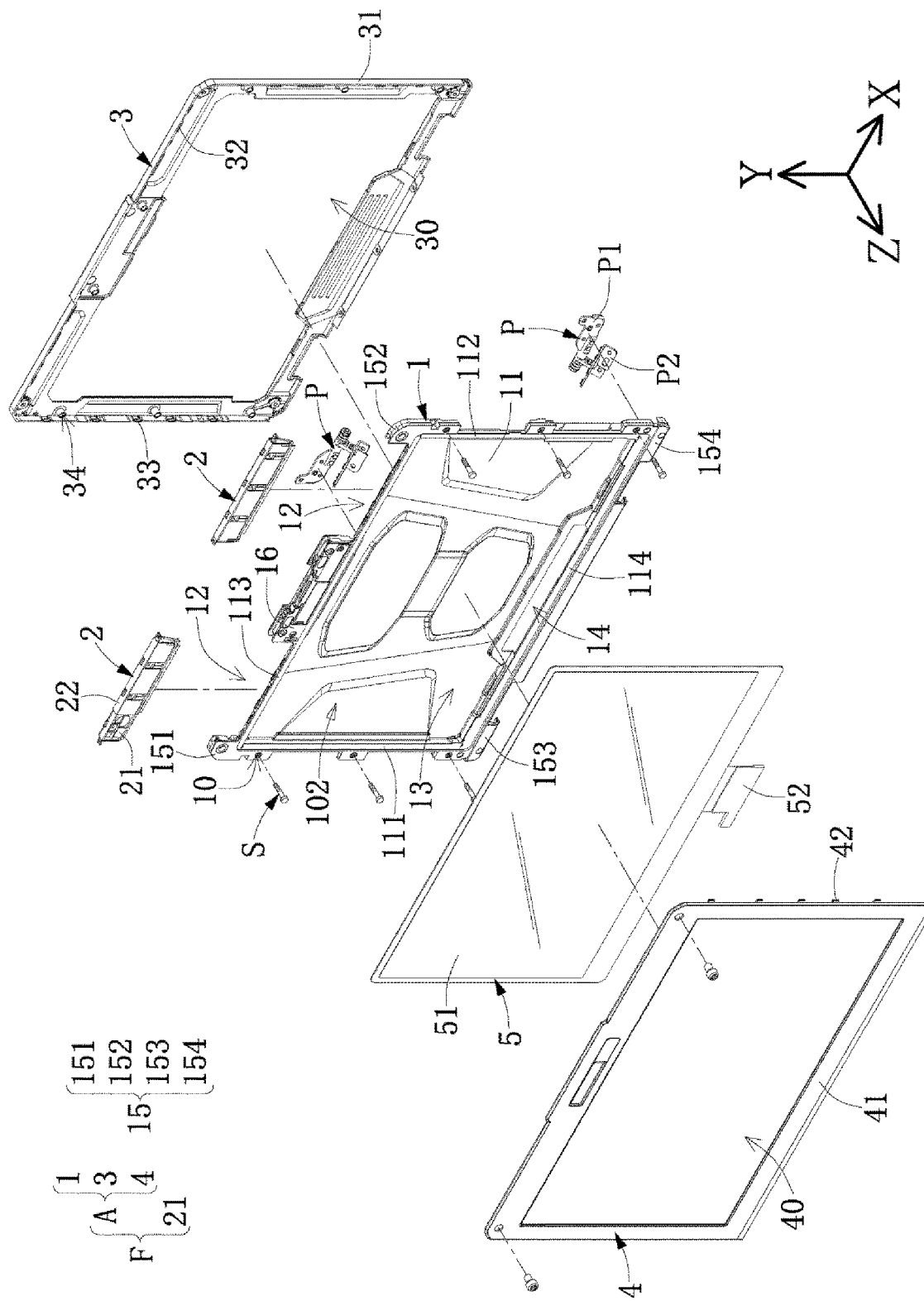
FIG. 4 is an exploded view of the electronic device according to an embodiment of the present disclosure.
Figure 5:
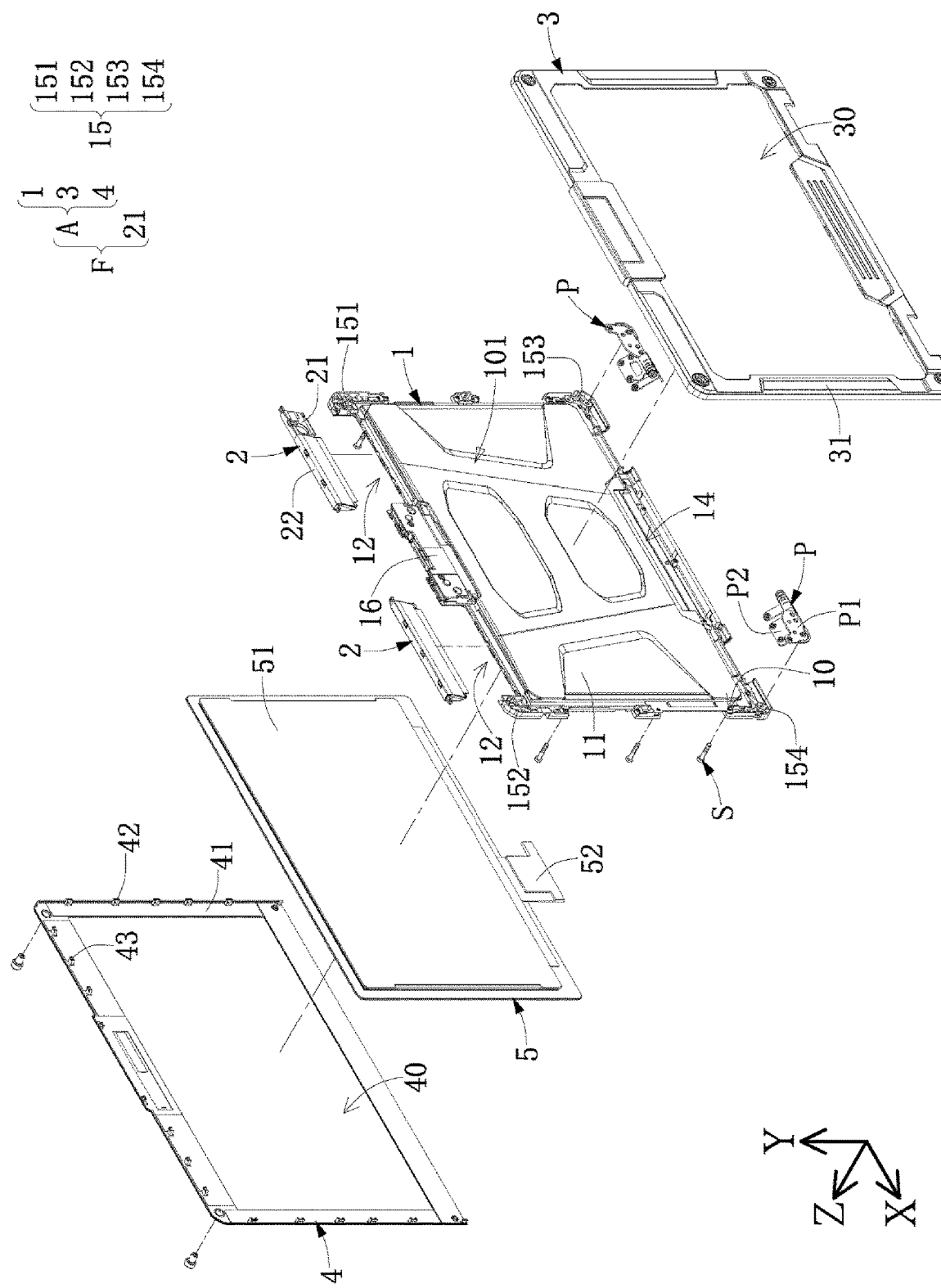
FIG. 5 is another exploded view of the electronic device according to an embodiment of the present disclosure.

Refer to FIG. 2 through FIG. 5. Both FIG. 4 and FIG. 5 are exploded views of the electronic device according to an embodiment of the present disclosure. The present disclosure provides an electronic device N and a framework assembly F for the same. The electronic device N comprises a base structure 1 and an antenna module 2. The antenna module 2 is disposed on the base structure 1. The base structure 1 has a first surface 101 and a second surface 102 corresponding in position to the first surface 101. The base structure 1 comprises a base body 11 and a receiving slot 12 disposed on the base body 11. The antenna module 2 is disposed in the receiving slot 12 of the base structure 1. The electronic device N further comprises a first decorative board 3 and/or a second decorative board 4. The first decorative board 3 is disposed on the first surface 101 of the base structure 1. The second decorative board 4 is disposed on the second surface 102 of the base structure 1. The electronic device N further comprises a panel 5. The panel 5 is disposed on the base structure 1. In an embodiment, the base structure 1 is made of metal, including but not limited to an aluminum-magnesium alloy, to support the panel 5 and protect the panel 5, but the present disclosure is not limited thereto. The electronic device N further comprises a pivotal unit P. The pivotal unit P is disposed on the base structure 1. The pivotal unit P comprises a first pivotal plate P1 disposed on the base structure 1 and a second pivotal plate P2 connected to the first pivotal plate P1 and capable of rotating pivotally relative to the first pivotal plate P1.

The base structure 1 further comprises a receiving recess 13 disposed on the base body 11. The panel 5 is disposed in the receiving recess 13. The panel 5 comprises a panel body 51 and a signal transmission line 52 connected to the panel body 51. For instance, the panel body 51 is disposed in the receiving recess 13 of the base structure 1 and abuts against the second surface 102. The panel body 51 is fixed to the second surface 102 of the base structure 1 with an adhesive (not shown). The base structure 1 further comprises a slit 14 penetrating the base body 11. The signal transmission line 52 passes through the slit 14.

The first decorative board 3 is disposed on the first surface 101 of the base structure 1. The first decorative board 3 has a first opening 30 for exposing the first surface 101 of the base structure 1. Therefore, when the first decorative board 3 is mounted on the base structure 1, the first surface 101 of the base structure 1 can be exposed from the first decorative board 3. For instance, the first decorative board 3 and the base structure 1 are made of different materials. In an embodiment, the first decorative board 3 is made of plastic, but the present disclosure is not limited thereto.

The second decorative board 4 is disposed on the second surface 102 of the base structure 1. The second decorative board 4 has a second opening 40 for exposing the panel body 51 disposed on the second surface 102 of the base structure 1. Therefore, when the second decorative board 4 is mounted on the base structure 1, the panel body 51 is exposed relative to the second decorative board 4. For instance, the second decorative board 4 and the base structure 1 are made of different materials. In an embodiment, the second decorative board 4 is made of plastic, but the present disclosure is not limited thereto.

Figure 6:
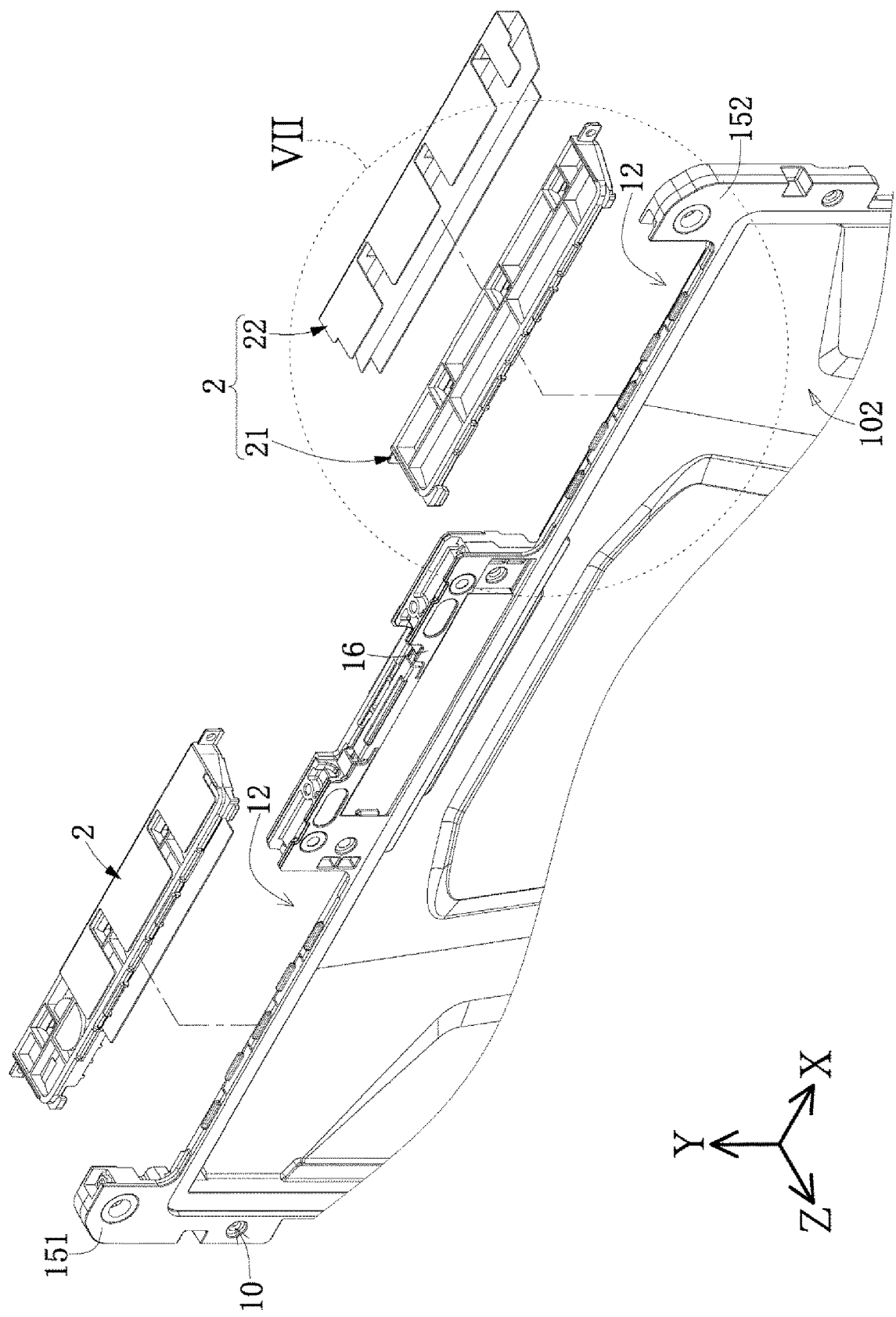
FIG. 6 is an exploded view of a base structure and an antenna module of the electronic device according to an embodiment of the present disclosure.
Figure 7:
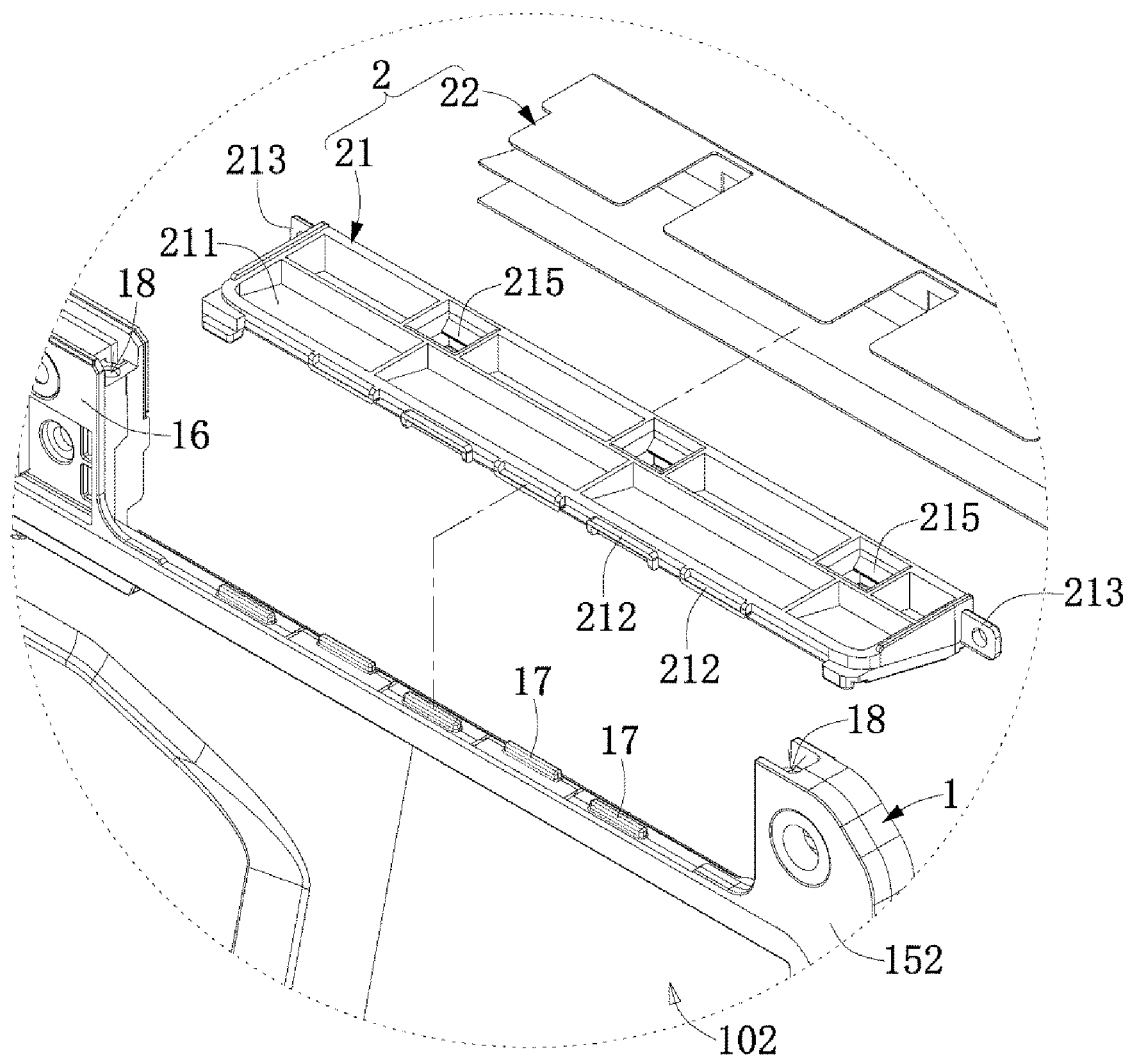
FIG. 7 is an enlarged view of part VII of FIG. 6.
Figure 8:
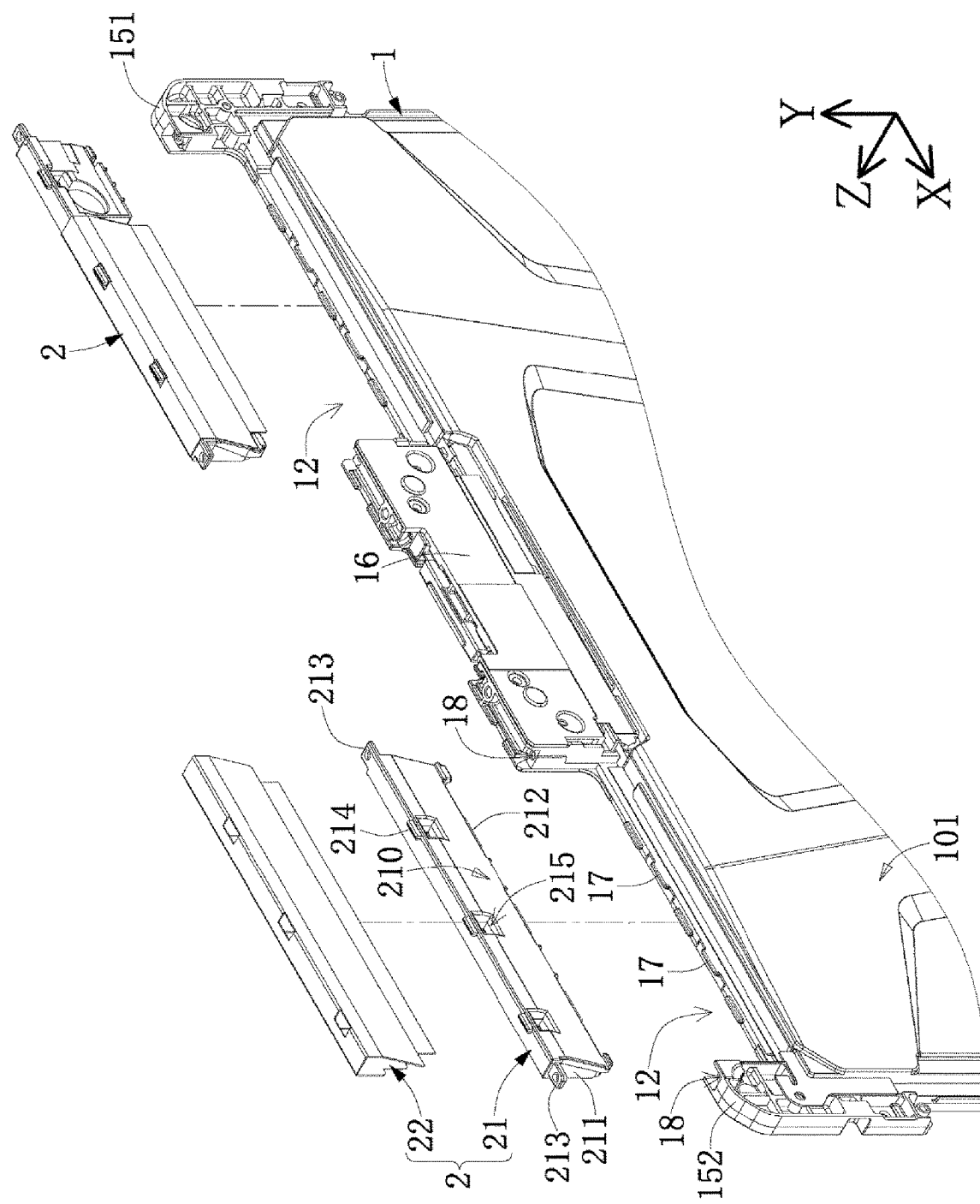
FIG. 8 is another exploded view of the base structure and the antenna module of the electronic device according to an embodiment of the present disclosure.
Figure 9:
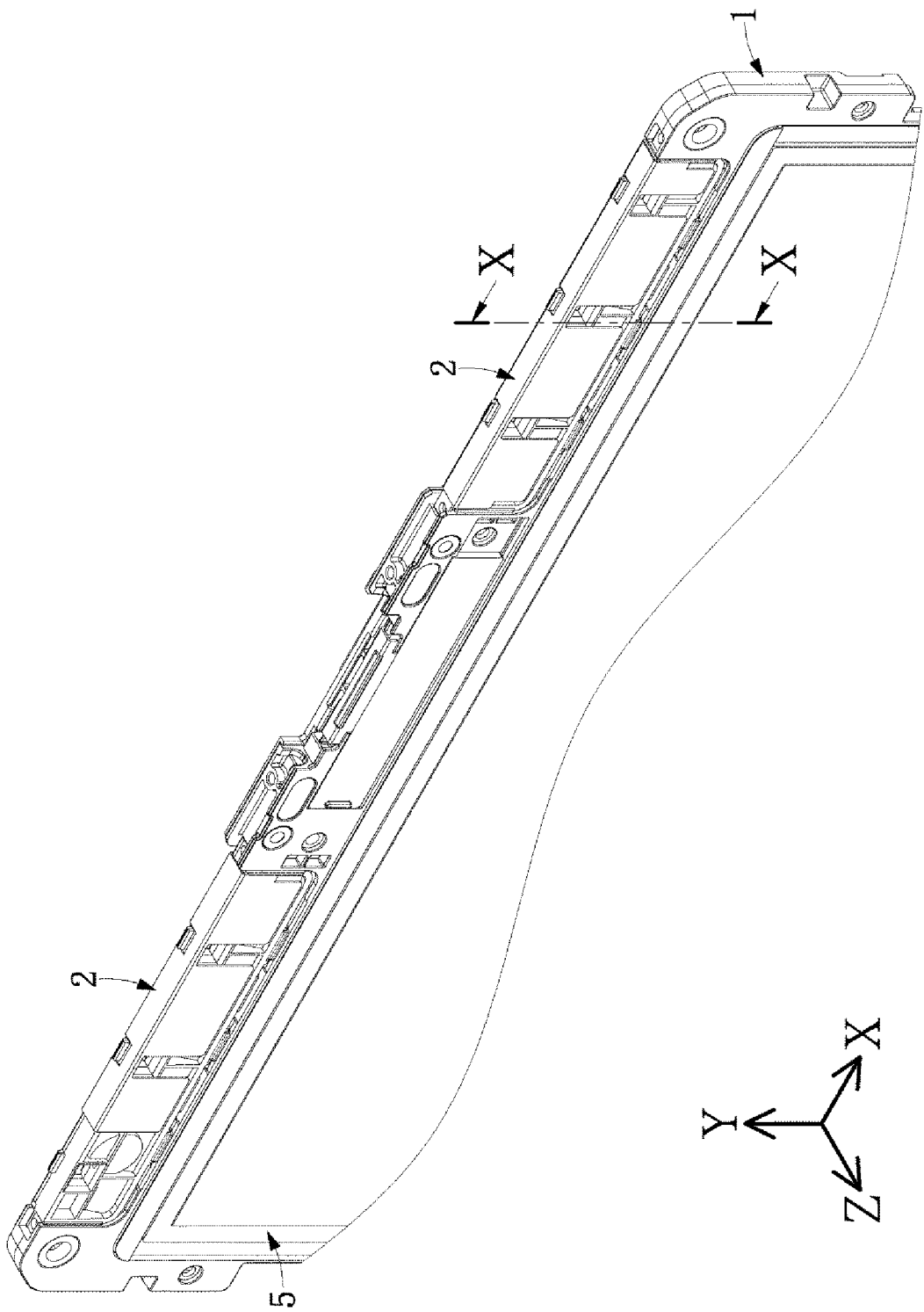
FIG. 9 is an assembled perspective view of the base structure and the antenna module of the electronic device according to an embodiment of the present disclosure.
Figure 10:
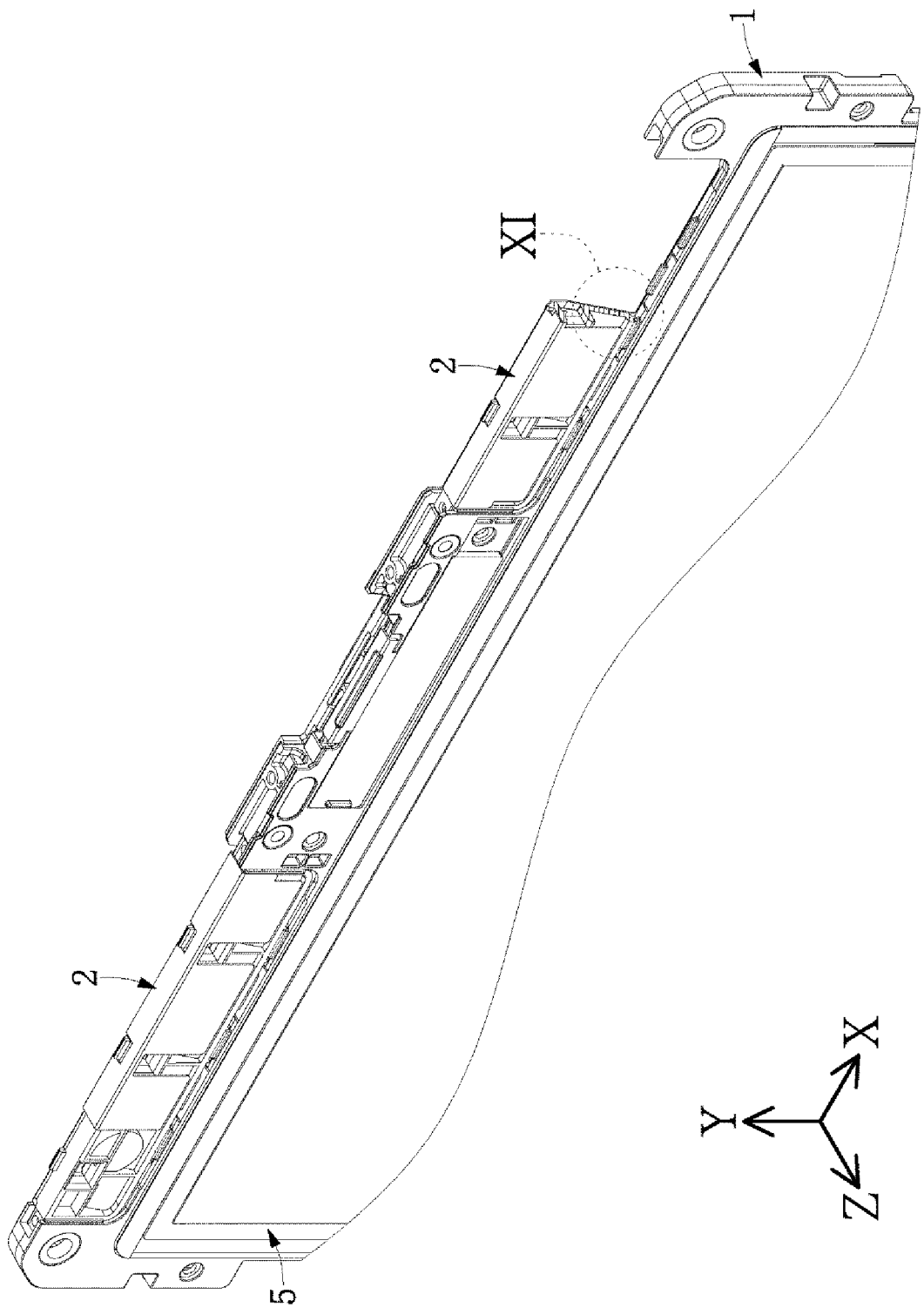
FIG. 10 is a cutaway view taken along X-X of FIG. 9.
Figure 11:
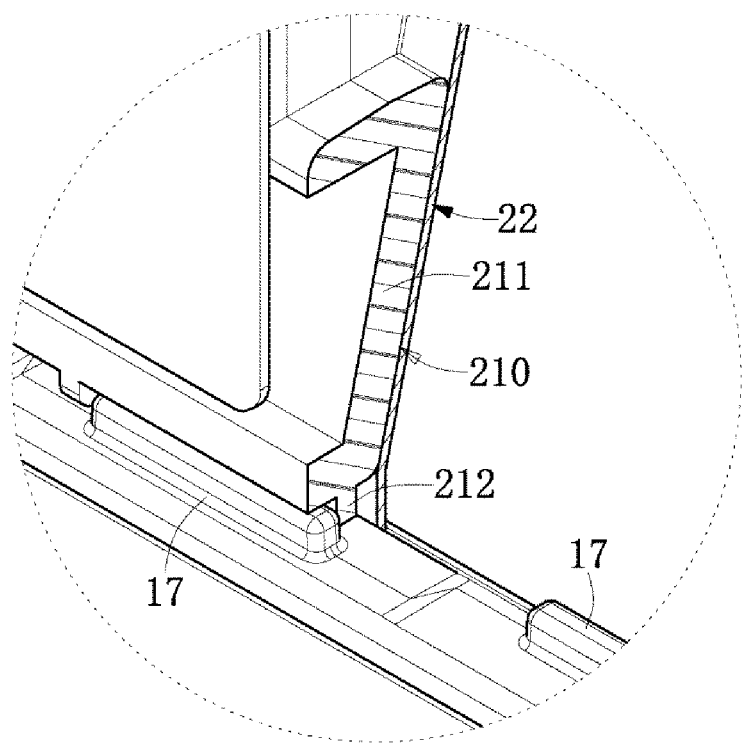
FIG. 11 is an enlarged view of part XI of FIG. 10.

Refer to FIG. 2 through FIG. 5 and FIG. 6 through FIG. 11. Both FIG. 6 and FIG. 8 are exploded views of a base structure and an antenna module of the electronic device according to an embodiment of the present disclosure. FIG. 7 is an enlarged view of part VII of FIG. 6. FIG. 9 is an assembled perspective view of the base structure and the antenna module of the electronic device according to an embodiment of the present disclosure. FIG. 10 is a cutaway view taken along X-X of FIG. 9. FIG. 11 is an enlarged view of part XI of FIG. 10. An embodiment of mounting the antenna module 2 on the base structure 1 is described below. The base body 11 has a first edge 111, a second edge 112 corresponding in position to the first edge 111, a third edge 113, and a fourth edge 114 corresponding in position to the third edge 113. The base structure 1 further comprises a plurality of extension angles 15 connected to corners of the base body 11, respectively. For instance, the base structure 1 comprises a first extension angle 151 connected to one of the corners of the base body 11 and a second extension angle 152 connected to another corner of the base body 11. The first extension angle 151 is disposed at the corner between the first edge 111 and the third edge 113. The second extension angle 152 is disposed at the corner between the second edge 112 and the third edge 113. The receiving slot 12 for receiving the antenna module 2 is disposed between the first extension angle 151 and the second extension angle 152.

Preferably, the base structure 1 further comprises a third extension angle 153 connected to yet another corner of the base body 11 and a fourth extension angle 154 connected to still yet another corner of the base body 11. The third extension angle 153 is disposed at the corner between the first edge 111 and the third edge 113. The fourth extension angle 154 is disposed at the corner between the second edge 112 and the fourth edge 114. The first extension angle 151, second extension angle 152, third extension angle 153 and fourth extension angle 154 are disposed at four corners of the receiving recess 13, respectively; thus, when the electronic device N falls, the first extension angle 151, second extension angle 152, third extension angle 153 and/or fourth extension angle 154 can protect the panel 5 against an impact which might otherwise damage the panel 5. Preferably, the base body 11, first extension angle 151, second extension angle 152, third extension angle 153 and fourth extension angle 154 are integrally formed, so as to form the base structure 1.

For instance, the electronic device N comprises two antenna modules 2. The base structure 1 comprises two receiving slots 12 and a lens holder 16 connected to the base body 11 and disposed between the two receiving slots 12. One of the receiving slots 12 is disposed between the first extension angle 151 and the lens holder 16. The other receiving slot 12 is disposed between the second extension angle 152 and the lens holder 16. However, the present disclosure is not limited thereto. The two receiving slots 12 are substantially identical in structure. The two antenna modules 2 are substantially identical in structure. Therefore, the assembly of the electronic device N is hereunder exemplified by only one of the receiving slots 12 and only one of the antenna modules 2.

The base structure 1 further comprises a first positioning portion 17 disposed on the receiving slot 12. The antenna module 2 further comprises a mount element 21 and an antenna 22 disposed on the mount element 21. The mount element 21 comprises a second positioning portion 212 corresponding in position to the first positioning portion 17. The first positioning portion 17 and second positioning portion 212 abut against each other and thus are coupled together, such that the antenna module 2 is fixed to the base structure 1 by the mount element 21. The base structure 1 further comprises a first engaging portion 18 disposed on the base body 11 and positioned proximate to the receiving slot 12. The mount element 21 further comprises a second engaging portion 213 corresponding in position to the first engaging portion 18. The mount element 21 further comprises a mount body 211. Both the second positioning portion 212 and second engaging portion 213 are disposed on the mount body 211. The antenna 22 shown in the accompanying drawings merely serves an illustrative purpose.

For instance, the base structure 1 may comprise a plurality of first positioning portions 17, and the mount element 21 may comprise a plurality of second positioning portions 212. The plurality of first positioning portions 17 protrudes and extends in a first direction (positive direction Y) relative to the base body 11. The plurality of second positioning portions 212 protrudes and extends in a second direction (negative direction Y) relative to the mount body 211. The first direction (positive direction Y) and the second direction (negative direction Y) are opposite. The plurality of first positioning portions 17 are arranged in an array and sequentially arranged in a predetermined arrangement direction (direction X) relative to the base body 11. One of the two adjacent first positioning portions 17 is closer to the first surface 101 than the other first positioning portion 17. One of the two adjacent first positioning portions 17 is closer to the second surface 102 than the other first positioning portion 17. The plurality of first positioning portions 17 are each I-shaped. Therefore, every two adjacent ones of the I-shaped first positioning portions 17 alternate.

The plurality of second positioning portions 212 are arranged in an array and sequentially arranged in a predetermined arrangement direction (direction X) relative to the mount body 211. The plurality of second positioning portions 212 are each U-shaped. The U-shaped second positioning portions 212 open toward the first surface 101 or second surface 102. In a variant embodiment, every two adjacent ones of the second positioning portions 212 open in opposite directions. In a variant embodiment, one of every two adjacent second positioning portions 212 opens toward the first surface 101, but the other one opens toward the second surface 102. Therefore, every two adjacent ones of the U-shaped second positioning portions 212 alternate.

For instance, the base structure 1 comprises two first engaging portions 18, and the two first engaging portions 18 are disposed at two ends of the receiving slot 12, respectively. One of the first engaging portions 18 is disposed at the first extension angle 151, and the other on the lens holder 16. The mount element 21 comprises two second engaging portions 213. The two second engaging portions 213 are disposed at two ends of the mount element 21, respectively. The first engaging portions 18 are each recess-shaped. The second engaging portions 213 are each protrusion-shaped. The second engaging portions 213 are received in the first engaging portions 18. In an embodiment, the first engaging portions 18 and second engaging portions 213 have corresponding screw holes (not denoted with any reference numerals) which mesh with screws (not shown) for fixing the second engaging portions 213 to the first engaging portions 18.

Therefore, when the antenna module 2 is disposed on the base structure 1, the first positioning portions 17 abut against the second positioning portions 212, respectively. The I-shaped first positioning portions 17 are received in the U-shaped second positioning portions 212. The second engaging portions 213 are received in the first engaging portions 18. Therefore, the antenna module 2 can only be removed in the first direction (positive direction Y) relative to the base structure 1. The present disclosure is not limited to whether the first engaging portions 18 and second engaging portions 213 have screw holes or not. Therefore, in a variant embodiment of the present disclosure, the antenna module 2 is disposed on the base structure 1 just because of the first positioning portions 17, second positioning portions 212, first engaging portions 18 and second engaging portions 213.

The base structure 1 is made of metal; thus, the antenna 22 is electrically connected to the base structure 1, such that the base structure 1 can be grounded. Part of the antenna 22 abuts against and/or is adhered to the first surface 101 of the base body 11, such that the antenna 22 is electrically connected to the base body 11. As shown in FIG. 11, to allow the antenna 22 to be firmly disposed on the first surface 101, the mount element 21 further comprises an inclined surface 210 disposed on the mount body 211. The terminal end of the inclined surface 210 is substantially flush with the point at which the antenna 22 abuts against and/or is adhered to the first surface 101. The presence of the inclined surface 210 adds to the adhesive area of the antenna 22.

Figure 12:
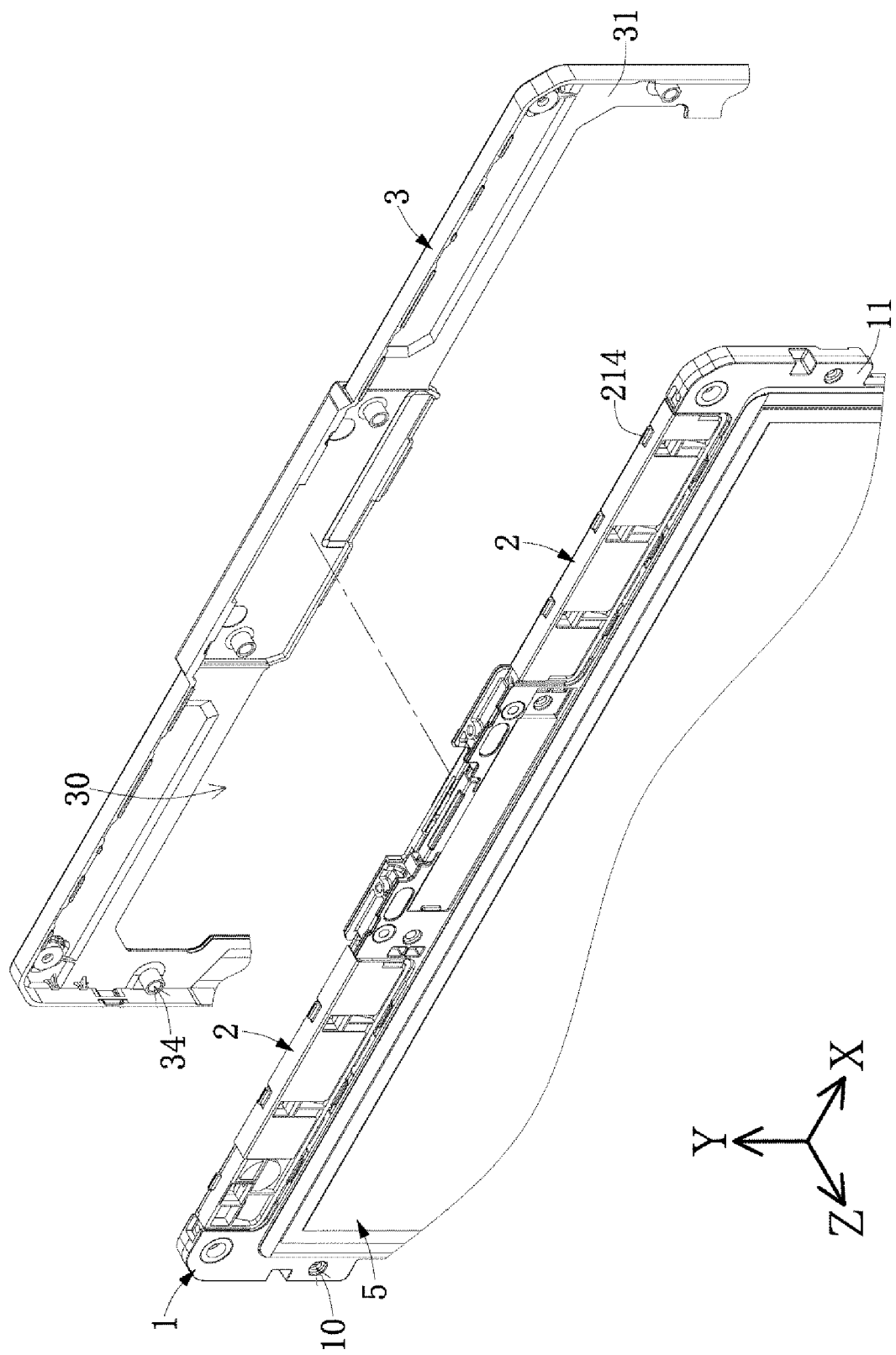
FIG. 12 is an exploded view of the base structure, antenna module and first decorative board of the electronic device according to an embodiment of the present disclosure.
Figure 13:
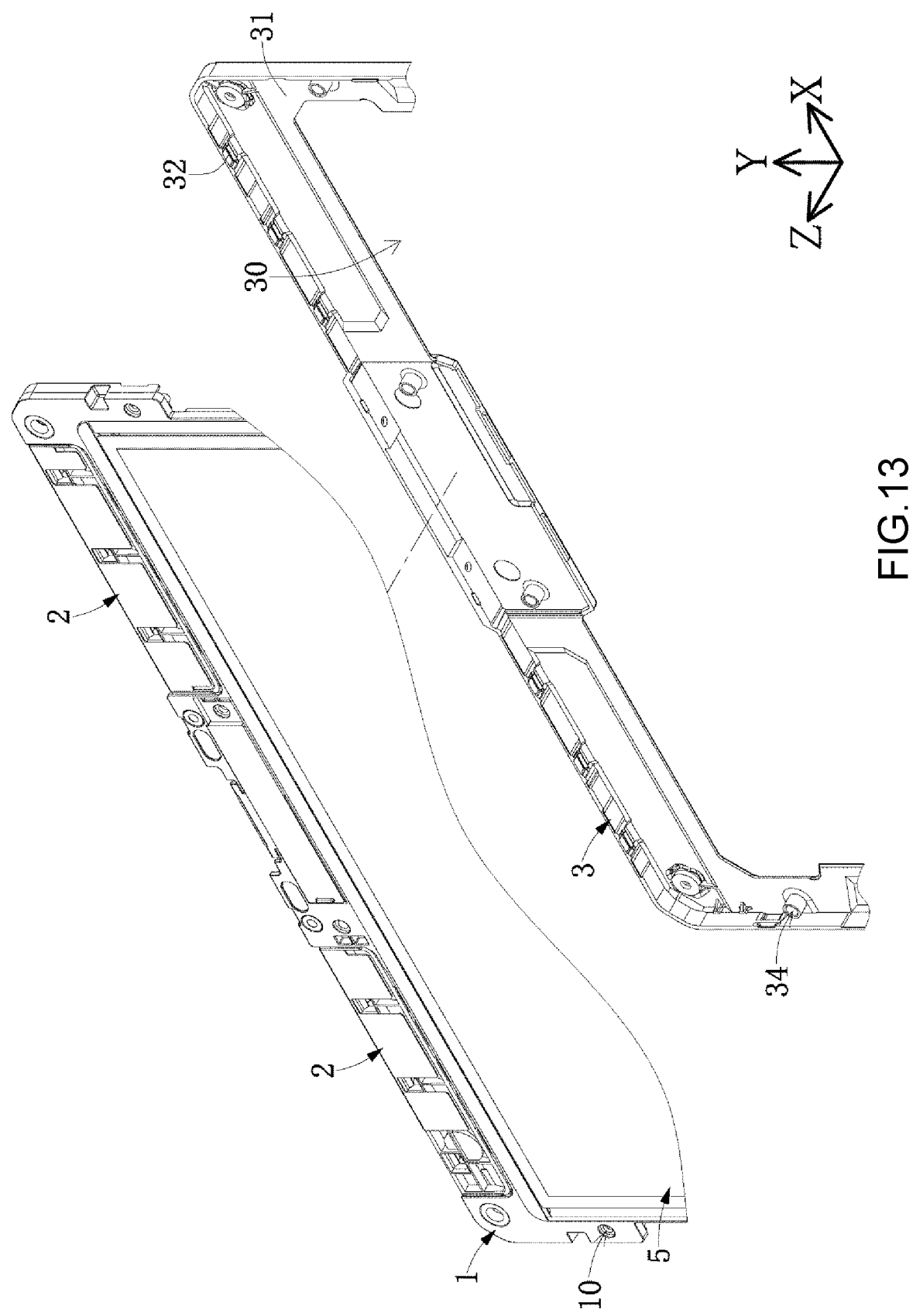
FIG. 13 is another exploded view of the base structure, antenna module and first decorative board of the electronic device the according to an embodiment of the present disclosure.
Figure 14:
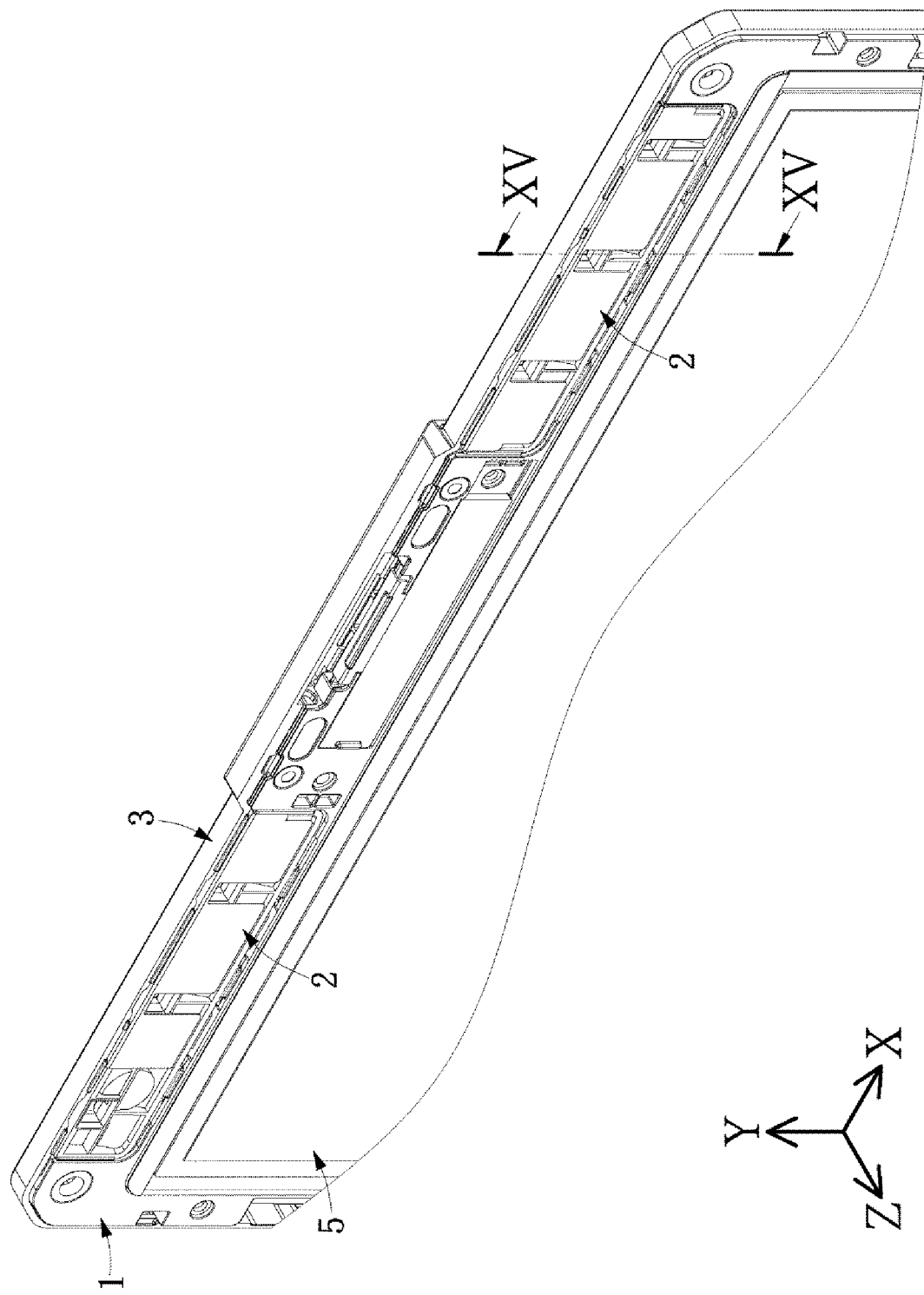
FIG. 14 is another assembled perspective view of the base structure, antenna module and first decorative board of the electronic device according to an embodiment of the present disclosure.
Figure 15:
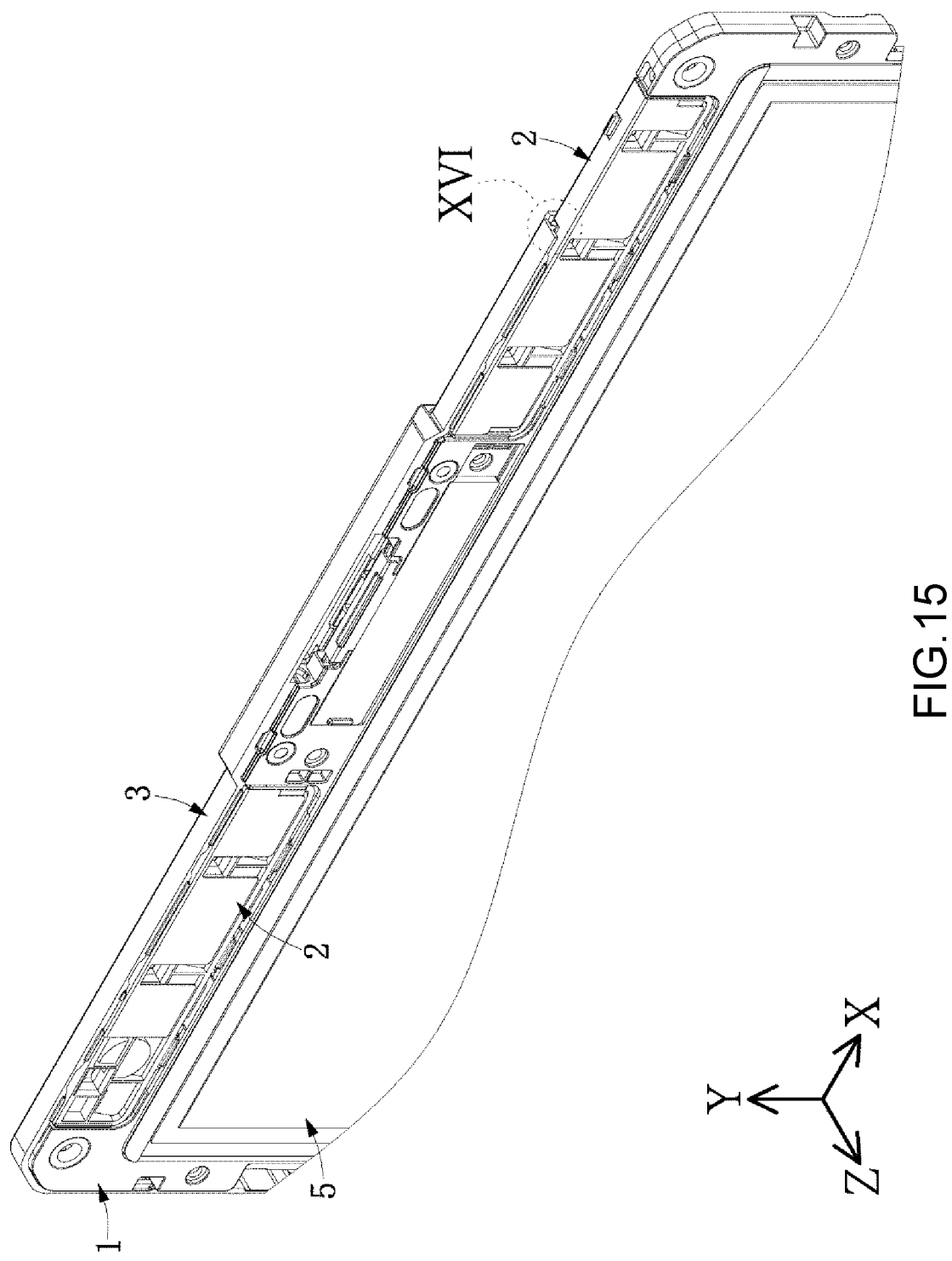
FIG. 15 is a cutaway view taken along line XV-XV of FIG. 14.
Figure 16:
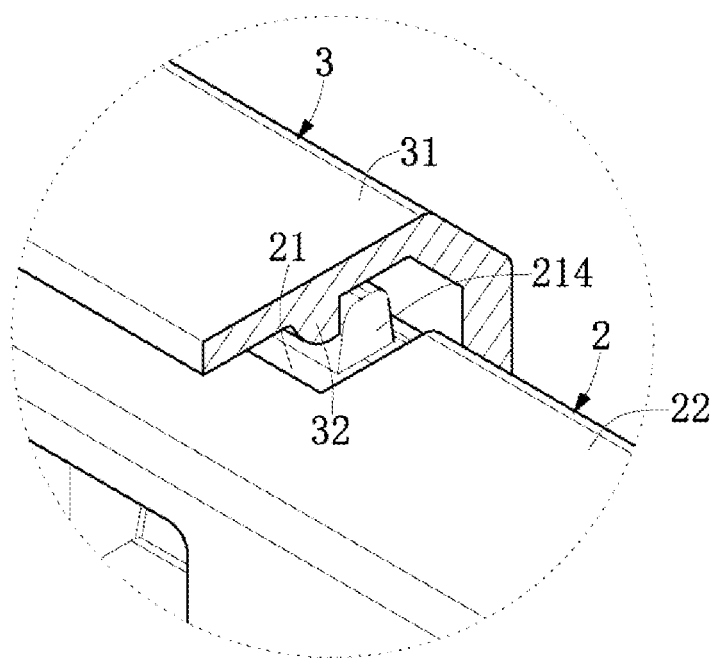
FIG. 16 is an enlarged view of part XVI of FIG. 15.

Refer to FIG. 2 through FIG. 5 and FIG. 12 through FIG. 16. Both FIG. 12 and FIG. 13 are exploded views of the base structure, antenna module and first decorative board of the electronic device according to an embodiment of the present disclosure. FIG. 14 is another assembled perspective view of the base structure, antenna module and first decorative board of the electronic device according to an embodiment of the present disclosure. FIG. 15 is a cutaway view taken along line XV-XV of FIG. 14. FIG. 16 is an enlarged view of part XVI of FIG. 15. An embodiment of the first decorative board 3 disposed on the base structure 1 is further described below. The mount element 21 further comprises a third positioning portion 214. The third positioning portion 214 is disposed on the mount body 211. The third positioning portion 214 extends in a first direction (positive direction Y) relative to the mount body 211. The second positioning portion 212 and third positioning portion 214 are disposed at two opposite edges of the mount element 21, respectively. The first decorative board 3 further comprises a first frame body 31 and a fourth positioning portion 32 disposed on the first frame body 31 and corresponding in position to the third positioning portion 214. The fourth positioning portion 32 protrudes and extends in a second direction (negative direction Y) relative to the first decorative board 3.

For instance, the mount element 21 comprises a plurality of third positioning portions 214, and the first decorative board 3 comprises a plurality of fourth positioning portions 32. The plurality of third positioning portions 214 are arranged in an array and sequentially arranged in a predetermined arrangement direction (direction X) relative to the mount body 211. The plurality of fourth positioning portions 32 are arranged in an array and sequentially arranged in a predetermined arrangement direction (direction X) relative to the first frame body 31. Therefore, when the first decorative board 3 is mounted in the direction of the base structure 1 and the antenna module 2, the third positioning portion 214 can abut against the fourth positioning portion 32, whereas the third positioning portion 214 and fourth positioning portion 32 can be coupled together, such that the first decorative board 3 is fixed to the base structure 1 and the antenna module 2.

The electronic device N further comprises a plurality of fastening elements S. The base body 11 of the base structure 1 further comprises a plurality of fastening holes 10. The first decorative board 3 further comprises a plurality of fastening holes 34. The plurality of fastening holes 34 of the first decorative board 3 correspond in position to the plurality of fastening holes 10 of the base body 11, respectively. The first decorative board 3 is further fixed to the base structure 1 by the plurality of fastening elements S. The first opening 30 is surrounded by the first frame body 31. The first frame body 31 covers the periphery and the slit 14 of the base structure 1. Therefore, the vertical projection of the slit 14 of the base structure 1 on the first decorative board 3 overlaps the first frame body 31 of the first decorative board 3 to allow the first decorative board 3 to cover the signal transmission line 52 and the slit 14 of the base structure 1.

Figure 17:
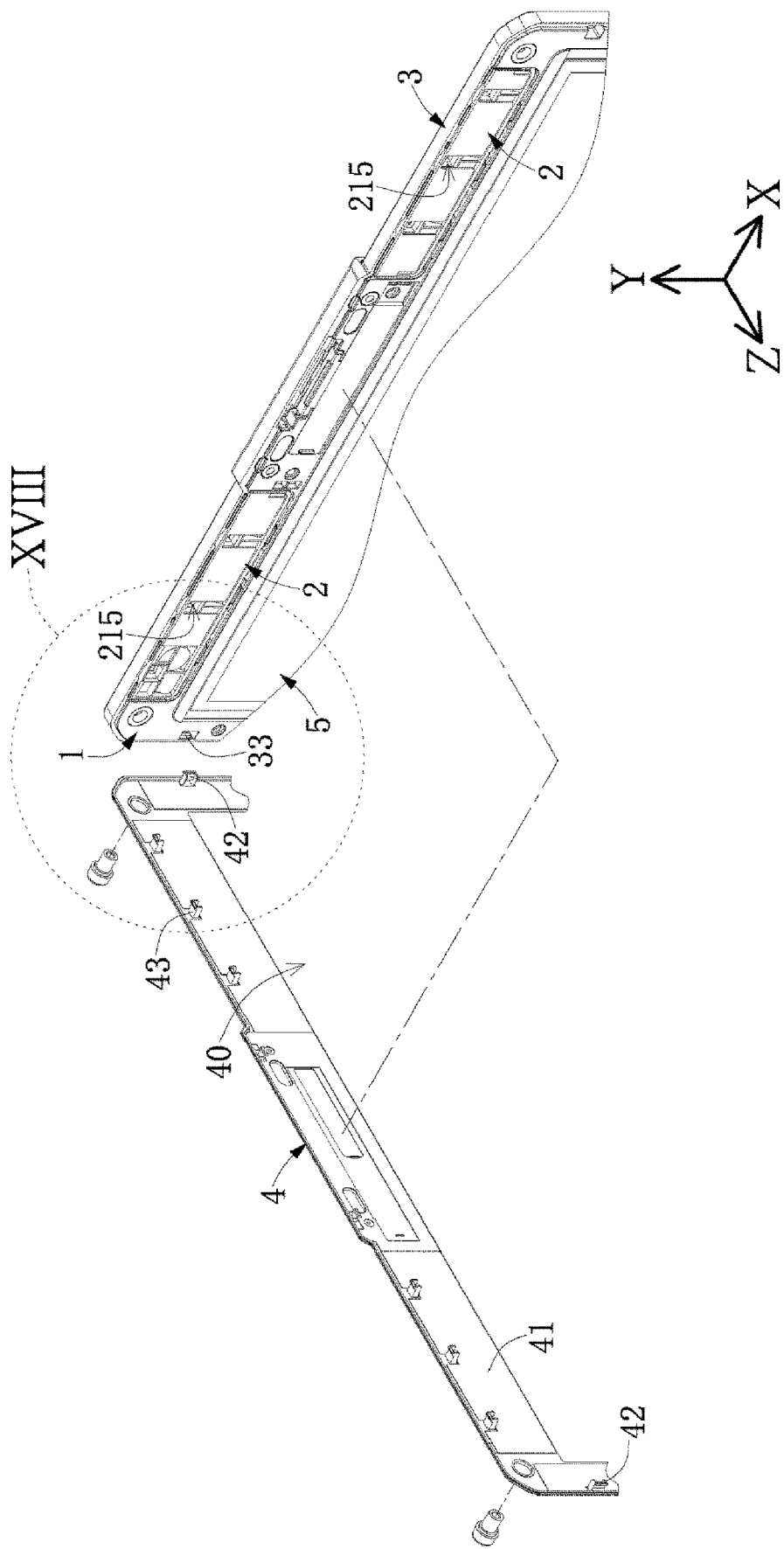
FIG. 17 is an exploded view of the base structure, antenna module, first decorative board and second decorative board of the electronic device according to an embodiment of the present disclosure.
Figure 18:
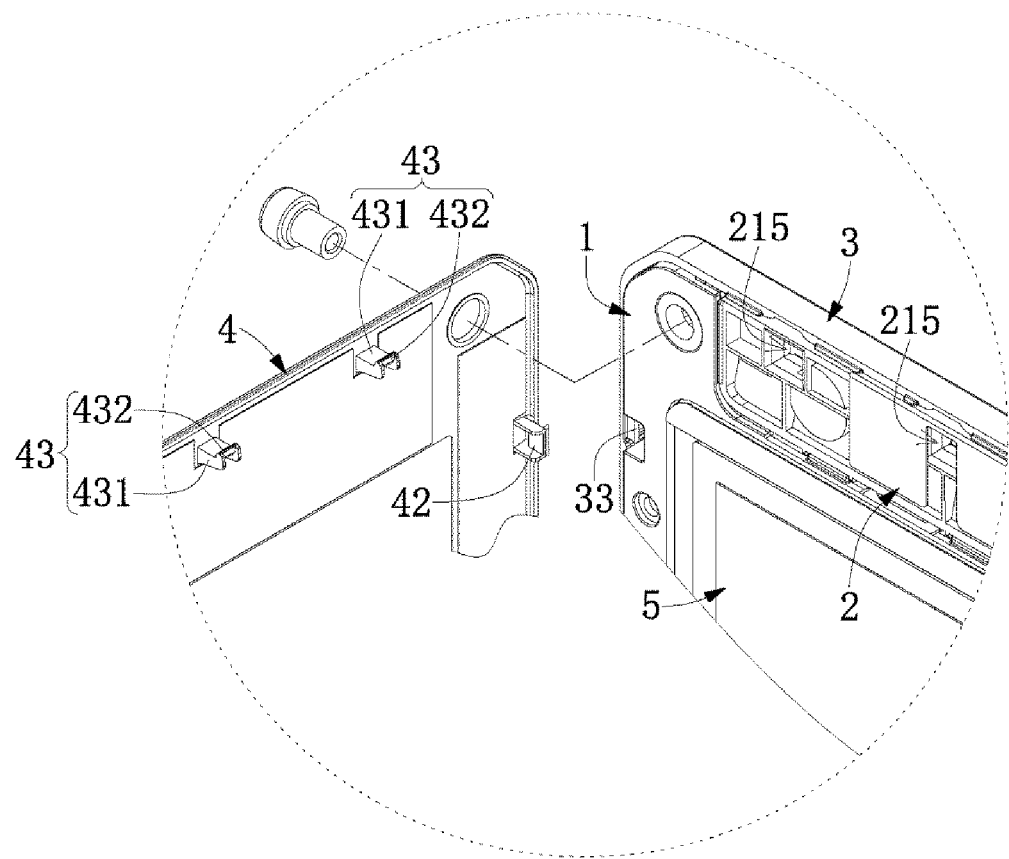
FIG. 18 is an enlarged view of part XVIII of FIG. 17.
Figure 19:
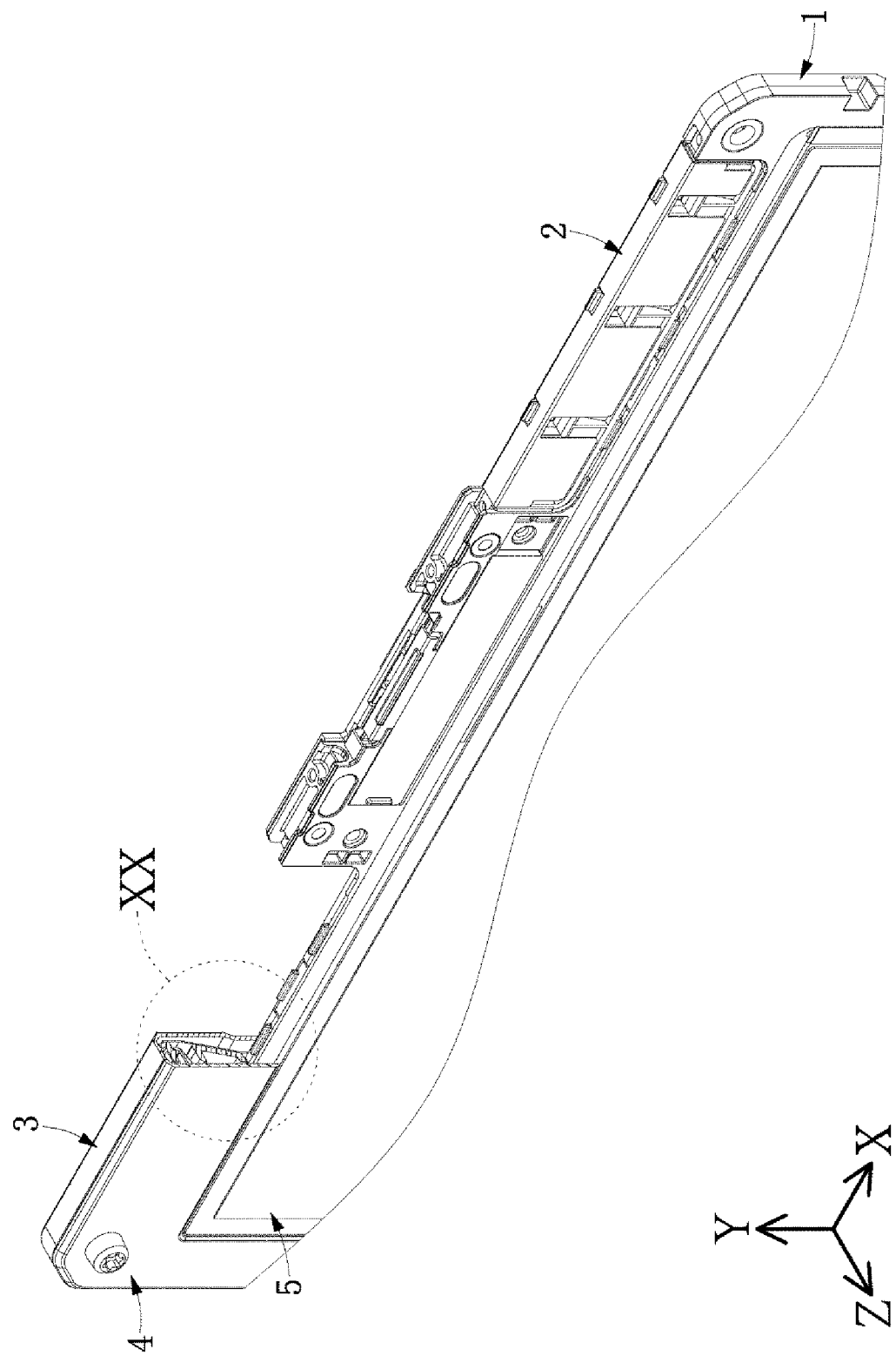
FIG. 19 is another exploded view of the base structure, antenna module, first decorative board and second decorative board of the electronic device according to an embodiment of the present disclosure.
Figure 20:
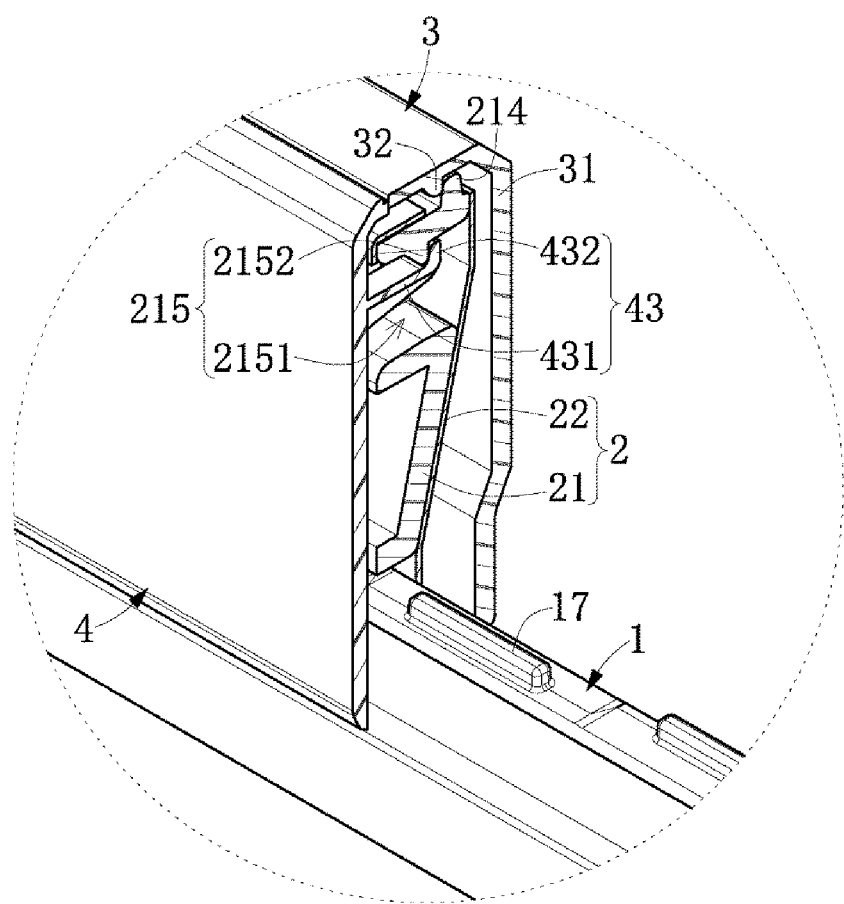
FIG. 20 is an enlarged view of part XX of FIG. 19.

Refer to FIG. 2 through FIG. 5 and FIG. 17 through FIG. 20, both FIG. 17 and FIG. 19 are exploded views of the base structure, antenna module, first decorative board and second decorative board of the electronic device according to an embodiment of the present disclosure. FIG. 18 is an enlarged view of part XVIII of FIG. 17. FIG. 20 is an enlarged view of part XX of FIG. 19. An embodiment of the second decorative board 4 disposed on the base structure 1 is further described below. The first decorative board 3 further comprises a first coupling portion 33 disposed on the first frame body 31. The second decorative board 4 further comprises a second coupling portion 42 disposed on a second frame body 41 and corresponding in position to the first coupling portion 33. The second coupling portion 42 of the second decorative board 4 is fixed to the first coupling portion 33 of the first decorative board 3. Therefore, the second coupling portion 42 of the second decorative board 4 is coupled to the first coupling portion 33 of the first decorative board 3, thereby fixing the second decorative board 4 to the first decorative board 3 and base structure 1. For instance, in the embodiments illustrated by the diagrams, the second coupling portion 42 is a hook, and the first coupling portion 33 is a loop-shaped recess, thereby allowing the second coupling portion 42 and the first coupling portion 33 to be engaged with each other. However, the present disclosure is not limited to the aforesaid shapes of the first coupling portion 33 and second coupling portion 42.

The mount element 21 further comprises a first limiting portion 215 disposed on the mount body 211. The second decorative board 4 further comprises a second limiting portion 43 disposed on the second frame body 41 and corresponding in position to the first limiting portion 215. The second limiting portion 43 of the second decorative board 4 is fixed to the first limiting portion 215 of the mount element 21. Thus, the antenna module 2 is fixed in place even in the absence of any screws, because of limitations placed on the displacement of the antenna module 2 relative to the base structure 1 by the first positioning portion 17, second positioning portion 212, first engaging portion 18 and second engaging portion 213, relative to the first decorative board 3 by the third positioning portion 214 and fourth positioning portion 32, and relative to the second decorative board 4 by the first limiting portion 215 and second limiting portion 43.

For instance, the first limiting portion 215 comprises an aperture 2151 dented relative to the mount body 211 and a first limiting body 2152 disposed in the aperture 2151. The second limiting portion 43 comprises a post 431 protruding relative to the second frame body 41 and a second limiting body 432 connected to the post 431. Thus, when the second limiting portion 43 of the second decorative board 4 is fixed to the first limiting portion 215 of the mount element 21, both the post 431 and the second limiting body 432 of the second limiting portion 43 are inserted into the aperture 2151 of the first limiting portion 215, and the second limiting body 432 is coupled to the first limiting body 2152. Although an embodiment illustrated by the diagrams is exemplified by the aperture 2151 penetrating the mount body 211, the aperture 2151 is a blind hole in a variant embodiment.

Referring to FIG. 4 through FIG. 16, the framework assembly F applicable to the electronic device N is illustrated by an embodiment and described below. The framework assembly F comprises a backboard A and a mount element 21. The backboard A comprises a base body 11, a receiving slot 12 disposed on the base body 11, and a first positioning portion 17 disposed on the receiving slot 12. The mount element 21 is disposed on the backboard A. The mount element 21 comprises a second positioning portion 212 corresponding in position to the first positioning portion 17. Preferably, the mount element 21 further comprises a mount body 211 and a third positioning portion 214 disposed on the mount body 211. The backboard A further comprises a fourth positioning portion 32 corresponding in position to the third positioning portion 214. The second positioning portion 212 and third positioning portion 214 of the mount element 21 are fixed to the first positioning portion 17 and fourth positioning portion 32 of the backboard A. Therefore, according to the present disclosure, the backboard A of the framework assembly F comprises the base structure 1 and the first decorative board 3.

Referring to FIG. 17 through FIG. 20, the framework assembly F further comprises a decorative board 4 (also referred to as the second decorative board 4), and the mount element 21 further comprises a first limiting portion 215 disposed on the mount body 211. The decorative board 4 further comprises a second limiting portion 43 corresponding in position to the first limiting portion 215. The second limiting portion 43 of the decorative board 4 is fixed to the first limiting portion 215 of the mount element 21. For the sake of brevity, the structural features of the first positioning portion 17, second positioning portion 212, third positioning portion 214, fourth positioning portion 32, first limiting portion 215 and second limiting portion 43 of the framework assembly F are not described hereunder, because these technical features are already described by and in the preceding description of the electronic device N.

Beneficial Effects of Embodiment

One of the beneficial effects of the present disclosure is as follows: according to the present disclosure, the electronic device N and the framework assembly F for the same are advantageously characterized in that the mount element 21 is firmly disposed on the base body 11, because the mount element 21 comprises a second positioning portion 212 corresponding in position to the first positioning portion 17.

The mount element 21 is fixed to the base body 11, first decorative board 3 and second decorative board 4 without using any screws, because of limitations placed on the displacement of the antenna module 2 relative to the base structure 1 by the first positioning portion 17, second positioning portion 212, first engaging portion 18 and second engaging portion 213, relative to the first decorative board 3 by the third positioning portion 214 and fourth positioning portion 32, and relative to the second decorative board 4 by the first limiting portion 215 and second limiting portion 43.

The panel 5 is disposed in the receiving recess 13, and the base structure 1 is made of metal, so as to enhance the overall structural strength of the electronic device N and protect the panel 5.

The present disclosure is disclosed above by preferred embodiments. However, the preferred embodiments are not restrictive of the claims of the present disclosure. Hence, all equivalent technical changes made to the aforesaid embodiments and based on the contents of the specification and drawings of the present disclosure shall fall within the scope of the claims of the present disclosure.

What is claimed is:

1. An electronic device, comprising:
a base structure having a first surface and a second surface corresponding in position to the first surface and comprising a base body, a receiving slot disposed on the base body, and a first positioning portion disposed on the receiving slot;
an antenna module disposed in the receiving slot of the base structure and comprising a mount element and an antenna disposed on the mount element, the mount element comprising a second positioning portion corresponding in position to the first positioning portion; and
a first decorative board disposed on the first surface of the base structure;
wherein the base structure further comprises a first engaging portion disposed on the base body and positioned proximate to the receiving slot, and the mount element further comprises a second engaging portion corresponding in position to the first engaging portion;
wherein the mount element further comprises a mount body which the second positioning portion and the second engaging portion are disposed on, wherein the first positioning portion protrudes and extends in a first direction relative to the base body, and the second positioning portion protrudes and extends in a second direction relative to the mount body;
wherein the mount element further comprises a third positioning portion disposed on the mount body and extending in the first direction relative to the mount body; and
wherein the first decorative board comprises a first frame body and a fourth positioning portion disposed on the first frame body and corresponding in position to the third positioning portion.

2. An electronic device, comprising:
a base structure having a first surface and a second surface corresponding in position to the first surface and comprising a base body, a receiving slot disposed on the base body, and a first positioning portion disposed on the receiving slot;
an antenna module disposed in the receiving slot of the base structure and comprising a mount element and an antenna disposed on the mount element, the mount element comprising a second positioning portion corresponding in position to the first positioning portion;
a first decorative board disposed on the first surface of the base structure; and
a second decorative board disposed on the second surface of the base structure, wherein the first decorative board comprises a first frame body and a first coupling portion disposed on the first frame body, and the second decorative board comprises a second frame body and a second coupling portion disposed on the second frame body, such that the second coupling portion of the second decorative board is fixed to the first coupling portion of the first decorative board;
wherein the mount element further comprises a mount body on which a first limiting portion is disposed, and the second decorative board further comprises a second limiting portion disposed on the second frame body and corresponding in position to the first limiting portion, such that the second limiting portion of the second decorative board is fixed to the first limiting portion of the mount element.

3. An electronic device, comprising:
a base structure having a first surface and a second surface corresponding in position to the first surface and comprising a base body, a receiving slot disposed on the base body, and a first positioning portion disposed on the receiving slot;
an antenna module disposed in the receiving slot of the base structure and comprising a mount element and an antenna disposed on the mount element, the mount element comprising a second positioning portion corresponding in position to the first positioning portion;
a first decorative board disposed on the first surface of the base structure; and
a panel, the panel comprising a panel body and a signal transmission line connected to the panel body, wherein the base structure further comprises a receiving recess disposed on the base body and a slit penetrating the base body, with the panel disposed in the receiving recess, and the signal transmission line passing through the slit;
wherein the first decorative board has a first opening for exposing the first surface of the base structure, and the second decorative board has a second opening for exposing the panel body disposed on the first surface of the base structure.

4. A framework assembly, comprising: a backboard comprising a base body, a receiving slot disposed on the base body, and a first positioning portion disposed on the receiving slot; and a mount element for an antenna disposed on the backboard and comprising a second positioning portion corresponding in position to the first positioning portion; and a decorative board disposed on the first surface of the base structure; wherein the base structure further comprises a first engaging portion disposed on the base body and positioned proximate to the receiving slot, and the mount element further comprises a second engaging portion corresponding in position to the first engaging portion; wherein the mount element further comprises a mount body which the second positioning portion and the second engaging portion are disposed on, wherein the first positioning portion protrudes and extends in a first direction relative to the base body, and the second positioning portion protrudes and extends in a second direction relative to the mount body; wherein the mount element further comprises a third positioning portion disposed on the mount body and extending in the first direction relative to the mount body; and wherein the decorative board comprises a first frame body and a fourth positioning portion disposed on the first frame body and corresponding in position to the third positioning portion.

5. A framework assembly, comprising: a backboard comprising a base body, a receiving slot disposed on the base body, and a first positioning portion disposed on the receiving slot; and a mount element for an antenna disposed on the backboard and comprising a second positioning portion corresponding in position to the first positioning portion; a first decorative board disposed on the first surface of the base structure; and a second decorative board disposed on the second surface of the base structure, wherein the first decorative board comprises a first frame body and a first coupling portion disposed on the first frame body, and the second decorative board comprises a second frame body and a second coupling portion disposed on the second frame body, such that the second coupling portion of the second decorative board is fixed to the first coupling portion of the first decorative board; wherein the mount element further comprises a mount body on which a first limiting portion disposed, and the second decorative board further comprises a second limiting portion disposed on the second frame body and corresponding in position to the first limiting portion, such that the second limiting portion of the second decorative board is fixed to the first limiting portion of the mount element.

\* \* \* \* \*